United States Patent
Mary et al.

(10) Patent No.: US 8,367,434 B2
(45) Date of Patent: Feb. 5, 2013

(54) METHOD FOR FABRICATING A NANOSTRUCTURED SUBSTRATE FOR OLED AND METHOD FOR FABRICATING AN OLED

(75) Inventors: Alexandre Mary, Sassenage (FR); Luc Andre, Grenoble (FR); Stefan Landis, Voiron (FR)

(73) Assignee: Commissariat a l'Energie Atomique, Paris (FR)

( * ) Notice: Subject to any disclaimer, the term of this patent is extended or adjusted under 35 U.S.C. 154(b) by 486 days.

(21) Appl. No.: 12/624,616

(22) Filed: Nov. 24, 2009

(65) Prior Publication Data

US 2010/0136724 A1 Jun. 3, 2010

(30) Foreign Application Priority Data

Nov. 28, 2008 (FR) ...................... 08 58120

(51) Int. Cl.
*H01L 21/00* (2006.01)
(52) U.S. Cl. ................ 438/22; 438/27; 438/29; 438/31; 438/32; 438/36
(58) Field of Classification Search ............... 438/22, 438/27, 29, 31, 32, 36
See application file for complete search history.

(56) References Cited

U.S. PATENT DOCUMENTS

| | | | |
|---|---|---|---|
| 6,080,030 A | 6/2000 | Isaka et al. | |
| 6,670,772 B1 | 12/2003 | Arnold et al. | |
| 7,414,263 B2 | 8/2008 | Choi et al. | |
| 7,741,145 B2 | 6/2010 | Choi et al. | |
| 2001/0038102 A1* | 11/2001 | Kawase | 257/98 |
| 2002/0048304 A1* | 4/2002 | Barnes et al. | 372/99 |
| 2003/0076589 A1* | 4/2003 | Suleski et al. | 359/558 |
| 2005/0088084 A1 | 4/2005 | Cok | |
| 2005/0141240 A1* | 6/2005 | Hata et al. | 362/600 |
| 2005/0205863 A1 | 9/2005 | Choi et al. | |
| 2007/0290225 A1* | 12/2007 | Lee et al. | 257/103 |
| 2007/0292986 A1 | 12/2007 | Fujii | |
| 2008/0304158 A1 | 12/2008 | Choi et al. | |
| 2009/0068915 A1 | 3/2009 | Choi et al. | |

FOREIGN PATENT DOCUMENTS

WO WO 2005/089028 A1 9/2005

OTHER PUBLICATIONS

International Search Report for European Patent Application No. EP09176670 dated Apr. 9, 2010.
French Search Report for French Patent Application No. FR0858120 dated Jun. 26, 2009.

(Continued)

*Primary Examiner* — Jae Lee
(74) *Attorney, Agent, or Firm* — Nixon Peabody LLP

(57) ABSTRACT

Method for fabricating a substrate comprising a nanostructured surface for an organic light emitting diode OLED, in which a layer of an organic resin or of a mineral material having a first nanostructuration is prepared by nano-imprint; the organic resin or mineral material is heated to a temperature equal to or higher than its glass transition temperature Tg or its melting point, and the organic resin or the mineral material is maintained at this temperature for a time $t_R$ called annealing time, whereby the organic resin or the mineral material flows and the first nanostructuration of the layer of organic resin or of mineral material is modified to produce a second nanostructuration; the organic resin or the mineral material is cooled.

19 Claims, 4 Drawing Sheets

OTHER PUBLICATIONS

W.L. Barnes, "Electromagnetic Crystals for Surface Plasmon Polaritons and the Extraction of Light from Emissive Devices," Journal of Lightwave Technology, vol. 17, No. 11, Nov. 1999, pp. 2170-2182.

Dawn K. Gifford, et al., "Emission through one of two metal electrodes of an organic light-emitting diode via surface-plasmon cross coupling," Applies Physics Letters, vol. 81, No. 23, Dec. 2002, pp. 4315-4317.

Dawn K. Gifford, et al., "Extraordinary transmission of organic photoluminescence through an otherwise opaque metal layer via surface plasmon cross coupling," Applied Physics Letters, vol. 80, No. 20, May 2002, pp. 3679-3681.

Kuniaki Ishihara, et al., "Organic light-emitting diodes with photonic crystals on glass substrate fabricated by nanoimprint lighography," Applied Physics Letters 90, 111114 (2007).

\* cited by examiner

US 8,367,434 B2

METHOD FOR FABRICATING A NANOSTRUCTURED SUBSTRATE FOR OLED AND METHOD FOR FABRICATING AN OLED

CROSS REFERENCE TO RELATED APPLICATIONS OR PRIORITY CLAIM

This application claims priority of French Patent Application No. 08 58120, filed Nov. 28, 2008.

DESCRIPTION

1. Technical Field

The invention relates to a method for fabricating a substrate comprising a nanostructured surface for an organic light emitting diode OLED.

The invention further relates to a method for fabricating an organic light emitting diode OLED comprising a step for fabricating a substrate comprising a nanostructured surface by the above method.

The technical field of the invention can be defined as that of organic light emitting diodes and more particularly as that of organic light emitting diodes provided with nanostructurations for reinforcing the light extraction.

2. Prior Art

Organic light emitting diodes are new-generation diodes and constitute a highly promising technology for displays, such as television screens and computer screens, etc., and for lighting, thanks to their low electric power consumption.

Simply described, an organic light emitting diode comprises a substrate or superstrate, an anode, a cathode and one or more emitting organic layer(s) provided between the anode and the cathode.

The electrode in contact with the substrate is generally the anode.

Light can be emitted on the anode side or on the cathode side.

The electrode through which the light emission occurs is transparent to this light.

A typical OLED, in which the light emission is provided on the anode and the substrate side thus comprises for example a substrate (which can also be called superstrate) made from glass, a transparent anode for example made from indium tin oxide (ITO), a stack of organic layers, and a metal mirror acting as a cathode.

FIG. 1 shows another typical OLED, in which the light emission occurs on the cathode side (3), that is the side opposite the anode (2) and the substrate (1).

This diode comprises one or more emitting organic thin layer(s) (4), for example three emitting organic thin layers which respectively emit in the red, the green and the blue, which are surrounded on the one hand by a metal anode (2) for example made from aluminium or silver in contact with the substrate (1) and, on the other hand, by a transparent cathode (3) consisting for example of ITO or a thin layer of silver.

Dielectric layers (5, 6) doped P (5) or N (6) also called electron or hole injection layers are generally added between the electrodes (2, 3) and the emitting layers (4) in order to improve the injection of charges (electrons (7) and holes (8)) in the organic emitting layers (4). Electron blocking (9) and hole blocking (10) layers may also be provided.

In an OLED and particularly in an OLED like the one shown in FIG. 1, the light is emitted in the organic layers in all directions.

Only a fraction of the photons emitted (about 20%) are really extracted from the diode (11) and 80% of the photons and the light are therefore lost (12) in the various electromagnetic modes relative to the metal and dielectric layers.

These lost photons, captured by the structure, are possibly absorbed by Joule effect or re-emitted on the edges of the diode. In all cases, these photons do not participate in the "useful light" of the diode.

It is therefore crucial to improve the extraction of the lost photons in order to convert them to useful photons and thereby increase the optical efficiency.

To recover part of the energy lost in the plasmons or the guided modes, the use of periodic arrays, gratings has been proposed for example in the document by W. L. BARNES, Journal of Lightwave Technology, Vol. 17, No. 11, November 1999, pages 2170-2182 [1].

These arrays may be one-dimensional, such as linear arrays sensitive to a polarization of the emitters, or two-dimensional, such as square, triangular arrays, Archimedes arrays, or arrays having a more complex geometry.

FIG. 2 shows a simplified view of an OLED with an anode (21), organic layers (22) and a cathode (23) which are provided with periodic structurations (24) consisting of patterns (25). These periodic structurations have a period P and a height h.

However, a poorly controlled structuration can cause a short-circuiting of the two electrodes, making the OLED stack unusable. Moreover, the technology for structuration of an OLED must necessarily be compatible with the manufacturing methods used in microelectronics.

The emitting organic layers of OLEDs are very sensitive to air, water and mechanical stresses.

Experience shows that the emitting molecules of these layers have serious difficulty withstanding the subsequent ("a posteriori") treatments after the overall production of the diode. This is why the structuration of the OLED is advantageously printed, carried out directly on the substrate as described in the document by D. K. GILFORD and D. G. HALL, Applied Physics Letters, Volume 81, Number 23, 2 Dec. 2002, pages 4315-4317 [2] and in the document by D. K. GILFORD and D. G. HALL, Applied Physics Letters, Volume 80, Number 20, 20 May 2002, pages 3679-3681 [3]. Since the deposits of the various metal and organic layers of the diode are matching ("conformant"), the array pattern is reproduced on the entire diode.

More precisely, the document by D. K. GILFORD and D. G. HALL, Applied Physics Letters, Volume 81, Number 23, 2 Dec. 2002, pages 4315-4317 [2], describes the fabrication of an OLED during which a layer of photoresist resin having a thickness of 80 mm is first deposited by spin-coating on a silicon substrate.

This layer of photoresist resin is then holographically printed and treated to form an array having a surface relief with a period of 550 nm and a peak-valley amplitude of about 60 nm.

On the layer of photoresist resin, five layers are successively deposited by vacuum deposition, that is a layer of gold, a layer of "NPB", a layer of aluminium tris(8-hydroquinoline) ($Alq_3$), a layer of aluminium and a layer of silver. The layer of gold forms the anode of the device while the Al/Ag layers form the cathode.

The layers deposited on the resin, reproduce the underlying array thereof, thereby forming a periodic waviness in the overall structure.

In the document by D. K. GILFORD and D. G. HALL, Applied Physics Letters, Volume 80, Number 20, 20 May 2002, pages 3679-3681 [3], strips, blades of glass are first coated with a thin layer (200 nm) of photoresist resin.

The photoresist resin films are then exposed to holographic interference fringes and developed to form an array having a surface relief with periods of 535 to 610 nm and peak-valley amplitudes of about 100 nm.

The samples are then coated under vacuum with a film of aluminium tris(8-hydroquinoline) ($Alq_3$), having a thickness of 200 nm, and then with a layer of silver having a thickness of 50 nm.

The deposited layers reproduce the profile of the underlying resin surface and thereby form wavinesses in the entire structure.

Furthermore, the document by K. ISHIHARA, Applied Physics Letters 90, 111114 (2007) [4] describes the fabrication of an OLED with a layer of two-dimensional photon crystals. A periodic two-dimensional waviness, that is a square lattice pattern, is formed on a glass substrate by a direct nano-imprint lithography (NIL) technique.

More precisely, a silicon mould is first fabricated with a square lattice pattern of circular bumps. This mould is placed in a nano-imprint lithography machine and a glass substrate is also placed on the mould. It is then heated under vacuum to a temperature above the glass transition temperature of the substrate. The pattern of the photon crystal layer on the mould is then stamped, embossed, on the glass surface by the piston, punch of the nano-imprint lithography machine, and the glass substrate is separated from the mould by cooling.

A transparent anode of indium zinc oxide (IZO) is deposited on the glass substrate by cathode sputtering, and the other layers of the OLED are then formed by vacuum evaporation.

Document US-B1-6 670 772 [5] deals with the preparation of an OLED screen which comprises a substrate, a layer of thin film transistors (TFT) formed on the substrate, an insulating layer formed on the "TFT" layer and defining a periodic array structure, a first electrode layer formed on the array structure and matching ("conforme") the array structure, a layer of "OLED" material formed on the first electrode layer and matching the array structure, and a second electrode layer formed on the OLED material layer and matching the array structure.

Document US-A1-2005/0088084[6] describes a device that is substantially similar to that of document [5].

Document US-A1-2001/0038102[7] describes a device for emitting light, such as an OLED, which comprises a substrate comprising two elements, that is a transparent base and a photopolymerizable resin.

The photopolymerizable resin is applied to the upper surface of the transparent base.

A stamping mould provided with ripples, ribs, serves to form a structuration in the resin layer.

A first electrode layer, an active layer and a second electrode layer are then successively deposited on the structured resin layer.

An overall structuration of the diode, as produced in the above-mentioned documents, allows the folding of the dispersion relations of the surface plasmon modes associated with all the metal-dielectric interfaces as mentioned in documents [4] and [5]. These modes, which are inherently evanescent, become radiative, causing a reinforcement of the light extraction that is indicated in the documents [4] to [7].

If we now focus on the methods for producing a nanostructured substrate, we find among the methods mentioned in the literature, the nano-imprint method, which is described in particular in documents [4] and [7].

This technique for fabricating a nanostructured substrate is compatible with the manufacturing processes used in microelectronics.

This technique is also suitable for mass production.

However, as stated in article [4] and patent [7], the shape of the pattern constituting the structure is directly related to the mould used, and several moulds are therefore required to produce different patterns and to fabricate a complex nanostructured surface.

Furthermore, both in the case of the nano-imprint technique and in the case of the other techniques for preparing substrates with a nanostructured surface, the control of the shape of the pattern is crucial, and may prove critical, because this shape has repercussions on all the layers which are then deposited to match this surface and therefore on the functioning of the overall device finally fabricated on this substrate such as an OLED.

In fact, if a pattern has very sudden edges or slopes, as shown in FIG. 3A, short-circuits (26) between the two electrodes (21, 23) may occur, making the OLED unusable.

Moreover, (see FIG. 3B), like all methods for fabricating substrates with nanostructured surfaces, nano-imprint may also locally produce patterns with defects (27) such as spikes, asperities, bumps, or a high roughness. The presence of these local defects (27) promotes the appearance of short-circuits (26).

In view of the above, a need therefore exists for a method for fabricating a substrate comprising a nanostructured surface for an organic light emitting diode OLED, which serves to produce such a nanostructured surface simply, reliably, reproducibly and in a limited number of steps, regardless of the type, shape and complexity of this nanostructuration and of the patterns constituting it.

A need also exists for such a method that serves to perfectly, very accurately control the nanostructuration, and particularly the shape of the patterns which may constitute it.

A need also exists for a method which serves to prepare a substrate with a nanostructured surface free of defects, such as spikes, asperities, bumps or other, without surface roughness, but also without sharp edges, slopes, or other excessively sudden geometric configurations, and more generally without shapes liable to cause short-circuits in an OLED diode prepared using this nanostructured surface.

This method must also be completely compatible with the manufacturing processes employed in microelectronics and particularly with the various processes used in the fabrication of OLEDs.

It is the goal of the present invention to provide a method for fabricating a substrate comprising a nanostructured surface for an organic light emitting diode OLED, which meets, inter alia, the needs and requirements listed above.

It is a further goal of the present invention to provide a method for fabricating a substrate comprising a nanostructured surface for an organic light emitting diode OLED, which does not have the drawbacks, defects, limitations and disadvantages of the methods of the prior art, and which solves the problems of the methods of the prior art.

SUMMARY OF THE INVENTION

This goal and others are achieved, according to the invention, by a method for fabricating a substrate comprising a nanostructured surface for an organic light emitting diode OLED, in which the following successive steps are carried out:

a) a layer of an organic resin or of a low melting point mineral material is deposited on a planar surface of a substrate;

b) the organic resin is heated to a temperature equal to or higher than its glass transition temperature Tg or its melting point, or the mineral material is heated to a temperature equal to or higher than its melting point, and the layer of liquid organic resin or mineral material is printed with a mould having a nanostructuration, whereby the layer of organic resin or mineral material is provided with a first nanostructuration matching the nanostructuration of the mould;

c) the temperature of the organic resin or of the mineral material is lowered to a temperature at which it is solid;

d) the mould is separated from the layer of organic resin or of mineral material joined (integral) to the substrate;

characterized in that the method further comprises the following successive steps:

e) the organic resin is heated to a temperature equal to or higher than its glass transition temperature Tg or its melting point, or the mineral material is heated to a temperature equal to or higher than its melting point, and the organic resin or the mineral material is maintained at this temperature for a time $t_R$ called annealing time, whereby the organic resin or the mineral material flows and the first nanostructuration of the layer of organic resin or of mineral material is modified to produce a second nanostructuration;

f) the organic resin or the mineral material is cooled below its glass transition temperature or its melting point to solidify it;

g) optionally, the solid organic resin or the solid mineral material is annealed.

Advantageously, the substrate may be a material selected from glass, transparent ceramics, and transparent plastics.

Advantageously, the organic resin may have a glass transition temperature Tg or a melting point higher than the subsequent deposition temperature(s) of one or more other(s) layer(s) on the nanostructured surface.

Advantageously, the mineral material may have a melting point higher than the subsequent deposition temperature(s) of one or more other(s) layer(s) on the nanostructured surface.

Advantageously, the organic resin may be selected from thermoplastic resins and thermosetting resins such as poly(styrene)s (PS), poly(methyl methacrylate)s (PMMA), unsaturated polyesters, epoxy resins, phenolic resins, polyimides, polyamides, polycarbonates, polyolefins such as polypropylenes, POSS or polyhedral oligomeric silsesquioxane and mixtures thereof.

Generally, the layer of organic resin or of mineral material may have a thickness of at least 10 nm, preferably of 10 nm to 10 μm.

The organic resin layer may be deposited by a method selected from:
  dip-coating;
  spin-coating;
  laminar-flow-coating;
  spray-coating;
  soak-coating;
  roll to roll process;
  painting coating;
  screen printing;
  chemical vapour deposition (CVD);
  plasma enhanced chemical vapour deposition (PECVD or PACVD).

The preferred methods are spray-coating and spin-coating.

Advantageously, the first nanostructuration may consist of a periodic array, such as a one-dimensional or a two-dimensional array.

The first nanostructuration may be a linear array with periodic patterns having a period P and a height h.

The first nanostructuration may also be an array of bumps, pads.

The annealing time $t_R$ in the case of a linear array may be expressed by the following formula. This formula is valid both for the mineral material and for the organic resin:

$$\frac{1}{t_R} = \frac{1}{\eta}\left(\frac{(2\pi)^4 \gamma}{3} \frac{e^3}{\lambda_n^4}\right)$$

where
  η is the viscosity of the resin, the polymer or of the mineral material,
  γ is the surface energy of the polymer or of the mineral material,
  e is the film thickness of the polymer or of the mineral material,
  $1/\lambda_n$ is the frequency of the spatial pattern to be caused to flow, that is, the frequency of the spatial pattern of the first nanostructuration.

This formula is valid only for linear arrays.

Other formulas expressing the annealing time may be established for the other nanostructurations. However, for arrays of bumps, pads, in particular, the analytical formula is much more difficult to establish.

Advantageously, the annealing time $t_R$ may be between 0 and 1000 seconds, preferably between 30 and 500 seconds, and even more preferably between 100 and 200 seconds.

Advantageously, the second nanostructuration is a nanostructuration free of defects and/or of shapes liable to cause short-circuits in an OLED.

Advantageously, the surface of the second nanostructuration may be described by a Fourier series decomposition, which does not exceed the $10^{th}$ order, for example which has the order 1, 2 or 5.

Advantageously, the surface of the second nanostructuration consists of sinusoidal patterns.

The inventive method may be defined as a method which uses the nano-imprint technique combined with the thermal and mechanical properties of organic resins, or of low melting point mineral materials, in order to control the nanostructuration and in particular the shape of the patterns making it up. Nano-imprint is a widely known and fully controlled technique which uses routine and proven equipment.

The inventive method comprises a specific succession of steps which has never been described nor suggested in the prior art, as represented in particular by the documents mentioned above.

In particular, step e) of the inventive method is neither described nor suggested in the prior art.

The inventive method for fabricating a substrate comprising a nanostructured surface for an organic light emitting diode OLED meets inter alia all the needs listed above and provides a solution to the problems of the prior art methods.

The inventive method is simple, reliable, easy to implement and serves to prepare, in an easy, controlled, reproducible manner, surfaces of which the nanostructure is perfectly, accurately controlled.

The inventive method only uses a single mould and does not require several moulds and moulding operations to obtain a nanostructured surface, even a complex one.

Thanks to the inventive method, substrates are obtained without local defects, without surface roughness, and the nanostructuration and particularly the shape of the patterns is perfectly and simply controlled by very simply adjusting the flow time, or annealing or relaxation time. The presence of patterns which are for example too "sharp" or have an excessive slope, is also avoided. In consequence, the nanostructuration and particularly the shape of the patterns of the layers subsequently deposited on the nanostructured surface is also controlled, and these layers no longer have defects, roughness or undesirable geometry. The shape of the patterns making up the extraction arrays of the diode is perfectly controlled and a reinforced but also accurately adjustable extraction can be obtained. Short-circuits in the diode prepared on the substrate prepared by the inventive method are also avoided.

The invention further relates to a method for fabricating an organic light emitting diode comprising a step of fabricating a substrate comprising a nanostructured surface in which the said step is carried out by the method as described above.

This method for fabricating an OLED inherently has all the advantages and effects already mentioned above associated with the method for preparing the nanostructured substrate, and the advantages of the method for fabricating an organic light emitting diode OLED according to the invention essentially derive from the method for preparing the nanostructured substrate and have already been largely discussed above.

Advantageously, in the inventive method for fabricating an OLED, a substrate comprising a nanostructured surface is fabricated, and a first electrode layer matching the nanostructured surface, one or more emitting organic layer(s) matching the nanostructured surface, and a second electrode layer matching the nanostructured surface are then successively deposited on the nanostructured surface of the substrate.

Preferably, the first electrode is an anode and the second electrode is a cathode.

Advantageously, one or more other layer(s) matching the nanostructured surface may further be deposited on the substrate, selected from a hole injection layer, a hole transport layer, an electron injection layer, an electron transport layer, a hole blocking layer, an electron blocking layer, a thin film transistor (TFT) layer, two or more from these other layer(s), the emitting organic layer(s), the first electrode layer and the second electrode layer optionally being combined.

The invention will be better understood from a reading of the detailed description that follows, provided for illustration and non-limiting, in conjunction with the appended drawings in which:

Figure 1:
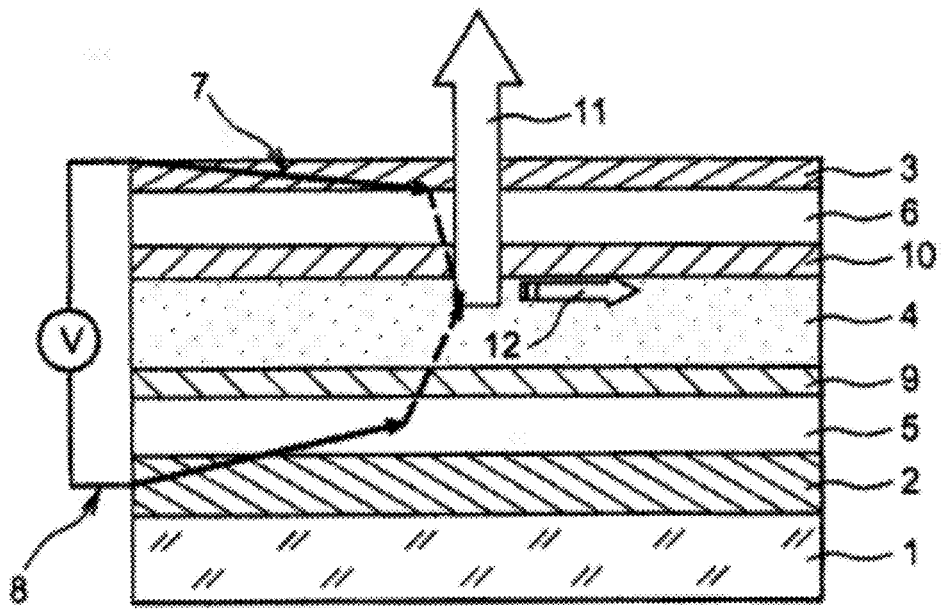
FIG. 1 shows a schematic vertical cross section view of an organic light emitting diode OLED.

The reflowing profile is plotted on the y-axis in nm and the x coordinate (in μm) is plotted on the x-axis.

Curve A (points □) corresponds to a flow time of 0 second.

Curve B (♦ grey points) corresponds to a flow time of 30 seconds.

Curve C (▲ grey points) corresponds to a flow time of 100 seconds.

Curve D (points X) corresponds to a flow time of 200 seconds.

Curve E (points ■) corresponds to a flow time of 500 seconds.

Curve F (points ○) corresponds to a flow time of 1000 seconds.

DETAILED DESCRIPTION OF PARTICULAR EMBODIMENTS

The inventive method for fabricating a substrate comprising a nanostructured surface for an organic light emitting diode OLED, first comprises a step during which a layer (41) of organic resin or of low melting point mineral material is deposited on a planar surface (43) of a substrate (42).

The substrate or superstrate (42) according to the arrangement of the organic light emitting diode may be made from any material suitable for the fabrication of a substrate for an OLED.

This substrate may be a transparent substrate, that is it transmits light, preferably visible light, or an opaque substrate.

It is obviously preferable for the substrate to transmit the light, to be transparent, in the case in which the light is emitted through the substrate, which is then generally rather a "superstrate".

Examples of suitable transparent materials are glasses, transparent ceramics and transparent plastics.

In the case in which the light is emitted by the upper electrode which is generally the cathode, the substrate may then be either a light transmitting substrate, a light reflecting substrate, or a light absorbing substrate.

The substrate comprises at least one planar surface (43) on which the organic resin (41) or the low melting point mineral material is deposited.

The substrate (42) may thus have the shape of a plate, a wafer or a slice, comprising two parallel planar surfaces, for example square, rectangular or even circular.

This plate, wafer or slice may have a thickness of one or a few microns (2, 3, 5, 10 μm) to one or a few millimetres (2, 3, 5, 10 mm), preferably between 1 μm and 3 mm, more preferably between 10 μm and 2 mm, and a surface for example in the form of a disk having a diameter of 20 or 30 cm.

The organic resin is advantageously selected from organic resins which have a glass transition temperature Tg or a melting point higher than the subsequent deposition temperature(s) of one or more other layer(s) on the nanostructured organic resin surface.

Similarly, the mineral material is advantageously selected from materials which have a melting point higher than the subsequent deposition temperature(s) of one or more other layer(s) on the nanostructured mineral material surface.

In the context of the present invention, glass transition temperature or melting point higher than the deposition temperature(s) generally means that the glass transition temperature or the melting point of the organic resin or of the mineral material is higher by at least 5° C., and preferably by at least 20° C., than the highest deposition temperature used for the subsequent deposition of the other layer(s), on the nanostructured surface of the layer of organic resin or mineral material.

This or these other layer(s) are those organic or mineral or metallic layers that make up an organic light emitting diode and are described in greater detail below.

Selecting such an organic resin with such a glass transition temperature or such a melting point, or such a mineral material with such a melting point to constitute the organic resin layer, which then forms the nanostructured surface, prevents the nanostructuration from being thermally deformed during the layer deposition steps which then occur in the fabrication of the OLED, thereby ensuring that the nanostructuration obtained on completion of the inventive method for fabricating a substrate comprising a nanostructured surface, is entirely preserved after each OLED fabrication step and at the end of the complete OLED fabrication method.

It should be observed that the glass transition temperature is the temperature at which certain polymers pass from a solid hard vitreous state to a plastic state. Above this temperature, these resins, polymers can be said to be fluid and can therefore flow.

The resin may be selected from thermoplastic resins and thermosetting resins.

In the context of the present invention, resin also means mixtures of two or more resins.

Examples of resins are poly(styrene)s (PS), poly(methyl methacrylate)s (PMMA), unsaturated polyesters, epoxy resins, phenolic resins, polyimides, polyamides, polycarbonates, polyolefins such as polypropylenes, POSS or polyhedral oligomeric silsesquioxane and mixtures thereof.

In the case of thermosetting resins, polymers, they may be applied in the form of a two-part composition comprising precursors of the resin with, for example, on the one hand, a formulation and, on the other hand, a crosslinking, hardening agent.

The mineral material has a low melting point.

In the context of the present invention, low melting point generally means that the mineral material has a melting point compatible with the subsequent OLED fabrication steps. In general, this melting point is lower than 200° C.

The low melting point mineral material is generally a metal or a metal alloy and it may be selected for example from indium, and the alloy based on antimony, tin, bismuth and lead which melts at 136° C.

In the context of the present invention, mineral material also means mixtures of two or more materials.

The organic resin layer (41) may be deposited by a technique selected from the following techniques:
dip-coating;
spin-coating;
laminar-flow-coating;
spray-coating;
soak coating;
roll to roll process;
painting coating;
screen printing.

All these techniques may be used in the inventive method, especially for depositing "thick" layers, having a thickness of about 10 µm for example.

In these techniques and particularly in the spin-coating technique, a solution of the resin, of the organic polymer in a solvent is used, generally a suitable organic solvent. By way of example, if the polymer is poly(methyl methacrylate) (PMMA), a solution of this polymer in toluene may be used.

The preferred technique is the spin-coating technique or the spray-coating technique. Apart from the solution techniques, the resin layer may be deposited by chemical vapour deposition (CVD) or plasma enhanced chemical vapour deposition (PECVD or PACVD).

For depositing the mineral material, use may be made of chemical vapour deposition (CVD), or plasma enhanced chemical vapour deposition (PECVD or PACVD), or a crystal growth technique, such as epitaxy.

The deposited layer is preferably a thin layer or a film of resin or of mineral material (41). In the context of the present invention, thin layer (41) generally means that the resin layer has a thickness of between a few nanometres and a few hundred nanometres, preferably between 10 and 500 nm.

The thickness of the layer, preferably thin, can be measured and controlled, for example by ellipsometric techniques.

Once the layer, preferably thin, of organic resin or of mineral material has been deposited, the resin or the mineral material or more generally the substrate which supports them, is heated (44) to a temperature at which they are in a liquid, fluid state, that is a temperature above the glass transition temperature Tg of the resin or a temperature higher than the melting point of the resin or of the mineral material, and the layer, preferably thin, of organic resin or of liquid mineral material is printed with a mould (45) having a predefined nanostructuration (46) whereby the layer, preferably thin, of organic resin or of mineral material (41) is provided with a first nanostructuration (47) matching the nanostructuration of the mould.

Figure 4A:
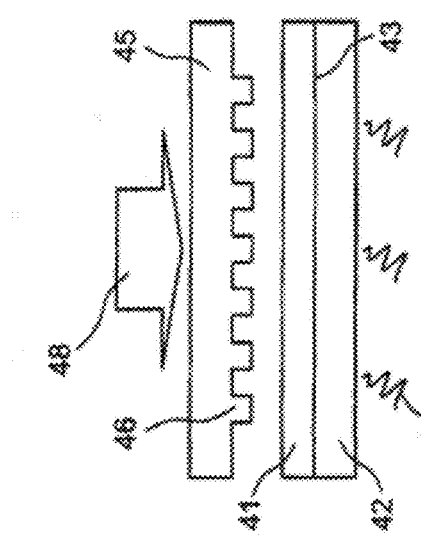
FIGS. 4A to 4F show schematic vertical cross sections views illustrating the successive steps of fabrication of a nanostructured substrate by the inventive method, using the nano-imprint technique.
Figure 4B:
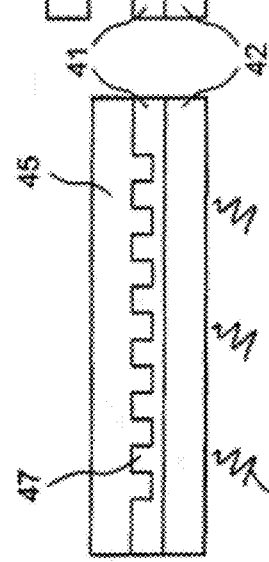

In other words, during this step, a mould (45), provided with a predefined nanostructuration, that is a mould of which the geometry is known, is contacted with the layer, preferably thin, of organic resin or of mineral material (41), and a certain pressure (48), for example of one to a few hundred mbar (2, 3, 5, 10) up to 10 or 20 bar, is then applied to the mould (FIGS. 4A and 4B).

The resin or the mineral material being heated (44) to a temperature at which they are liquid, fluid, that is a temperature higher than the glass transition temperature of the resin or to a temperature higher than the melting point of the resin or of the mineral material, the mould is printed in the film of molten polymer or mineral material (41, FIG. 4B) which is thereby provided with a first nanostructuration matching the nanostructuration of the mould.

The mould may be made from a material such as silica or silicon or nickel or a SiX alloy.

Once the resin, polymer or the mineral material has been shaped and has therefore been provided with a nanostructuration matching that of the mould, the temperature of the resin or of the mineral material is lowered to a temperature at which it is solid. Thus in the case of a resin having a glass transition temperature, the temperature of the resin is lowered to a temperature lower than the glass transition temperature, at which it is in a solid state.

The mould (45) is then separated (49) from the layer, preferably thin, of solid organic resin or of solid mineral material (41) joined to the substrate (42).

At this stage of the method, a layer, preferably thin, of resin or of mineral material has been obtained, provided with a first nanostructuration (47) matching the nanostructuration (46) with which the mould was provided.

At this stage, steps of characterization, testing, verification, measurement of the nanostructured surface obtained, may then optionally be carried out.

For example, steps of fine morphological characterization of the nanostructured surface may be carried out in order to ensure the conformity of the printed patterns with those of the mould, and techniques such as atomic force microscopy are ideal for this purpose.

The nanostructuration of the mould, which matches the first nanostructuration of the organic resin or of the mineral material, may consist of a periodic array.

This periodic array may be a one-dimensional array or a two-dimensional array.

Figure 2:
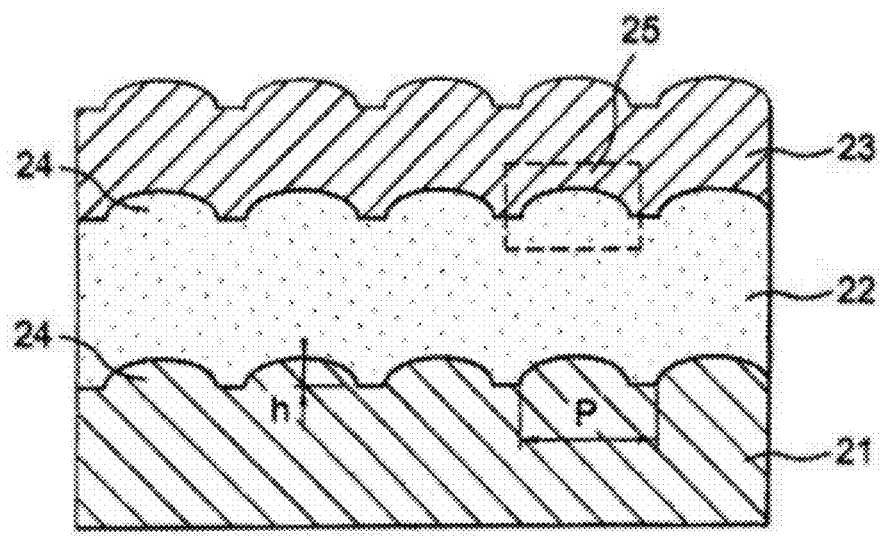
FIG. 2 shows a schematic vertical cross section view of an OLED with nanostructurations for optical extraction.

Such a one-dimensional array may for example be a linear array with periodic patterns having a period P and a height h (see FIG. 2).

The period P may be of 100 nm to a few microns, preferably of 100 nm to 1 μm, preferably of 200 to 600 nm, and the height h may be at least 5 nm to 100 nm, and preferably of 5 nm to 40 nm.

If the array is a two-dimensional array, it may be selected in particular from square arrays, triangular, rectangular, hexagonal arrays, and more complex arrays such as Archimedes arrays.

The array may also be an array of bumps, pads.

It should be noted that the first nanostructuration generally has simple, non-rounded geometric patterns.

Figure 3A:
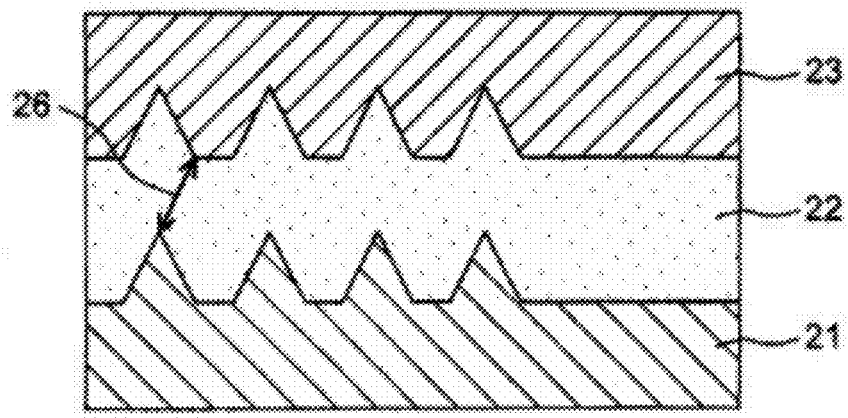
FIG. 3A shows a schematic vertical cross section view of an OLED of which the organic layers, the anode and the cathode have patterns with an excessive slope liable to cause short-circuits.
Figure 3B:
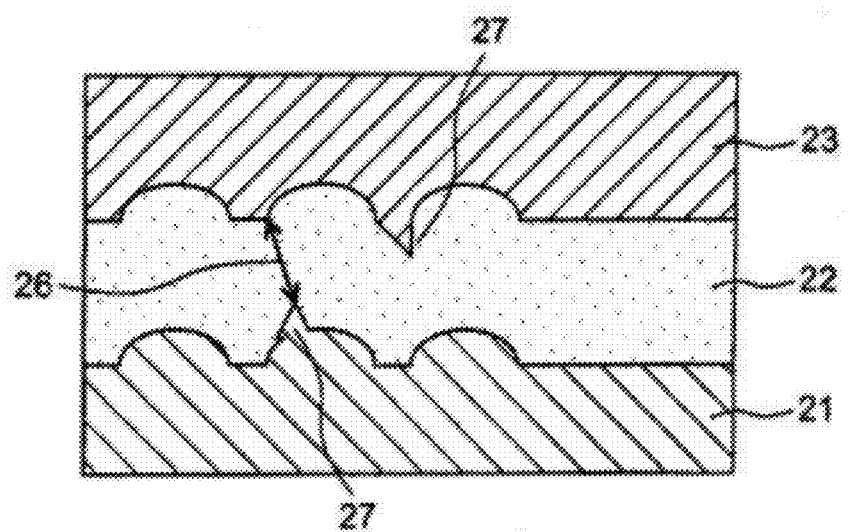
FIG. 3B shows a schematic vertical cross section view of an OLED of which the organic layers, the anode and the cathode have patterns with defects liable to cause short-circuits.
Figure 4C:
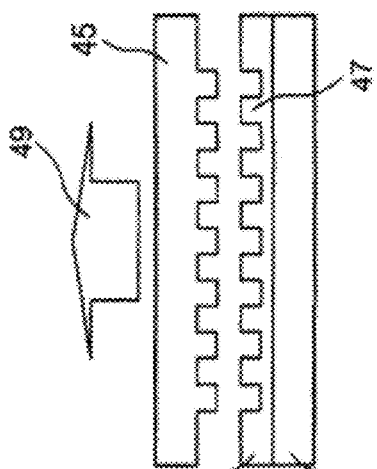
Figure 4D:
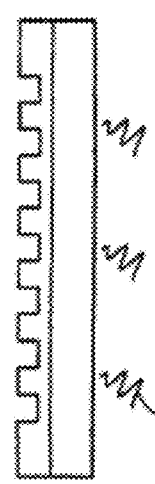

For example, the lines may have a triangular (FIG. 3A), rectangular or square (FIGS. 4C, 4D) cross section.

The first nanostructuration may comprise defects, such as bumps, roughness, discontinuities (in alignment), setbacks, asperities, spikes, etc. and/or patterns with acute, obtuse, right angles, for example patterns with a high slope, sharp edges, which must be eliminated or reduced, "softened", "rounded" in order to avoid the appearance of short-circuits in the OLED.

According to the invention, the layer, preferably thin, of organic resin or of mineral material provided with the first nanostructuration (47), joined to the substrate, is heated (44) (FIG. 4D) to a temperature equal to or higher than the glass transition temperature Tg of the resin, equal to or higher than the melting point of the resin, or equal to or higher than the melting point of the mineral material, and the resin or the mineral material is maintained at this temperature for a time $t_R$ called annealing time, flow time or relaxation time.

Figure 4E:
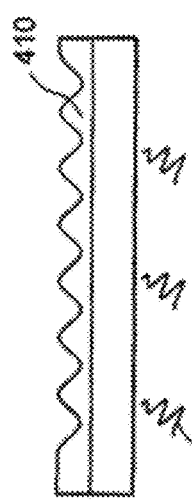
Figure 4F:
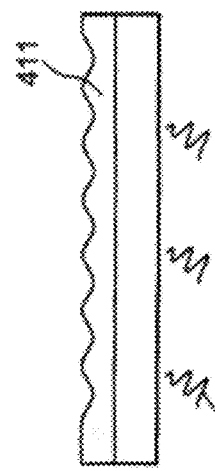

The resin or the mineral material constituting the first nanostructuration and its patterns is fluidized, flows ("flue"), creeps (FIG. 4D), and the first nanostructuration of the thin resin layer and its patterns are thereby modified to produce a second nanostructuration (410) (FIG. 4E) then (411) (FIG. 4F).

This step may be defined as a final step of shaping the surface of the layer of resin or of mineral material, which uses the flow properties of the resin or of the mineral material.

This step may be perfectly modelled, controlled and allows very reliable and very accurate control of the second nanostructuration, for example of the shape of the pattern making up the periodic array in the case in which the second nanostructuration consists of such a periodic array.

Thus, to model this step, the topography of the substrate provided with the first nanostructuration is expressed in the form of a spectral decomposition.

The relaxation or annealing time $t_R$ depends on the spatial frequency of the pattern of resin or of mineral material to be caused to flow and may be expressed by the following formula in the case of a linear array:

$$\frac{1}{t_R} = \frac{1}{\eta}\left(\frac{(2\pi)^4 \gamma}{3} \frac{e^3}{\lambda_n^4}\right)$$

where

η is the viscosity of the resin, the polymer or of the mineral material,

γ is the surface energy of the resin or of the polymer or of the mineral material, e is the film thickness of the resin or of the polymer or of the mineral material, $1/\lambda_n$ is the frequency of the spatial pattern to be caused to flow ("fluer"), that is, the frequency of the spatial pattern of the first nanostructuration.

This equation shows that the higher the spatial frequency, the longer the relaxation, annealing, flow time.

Figure 5:
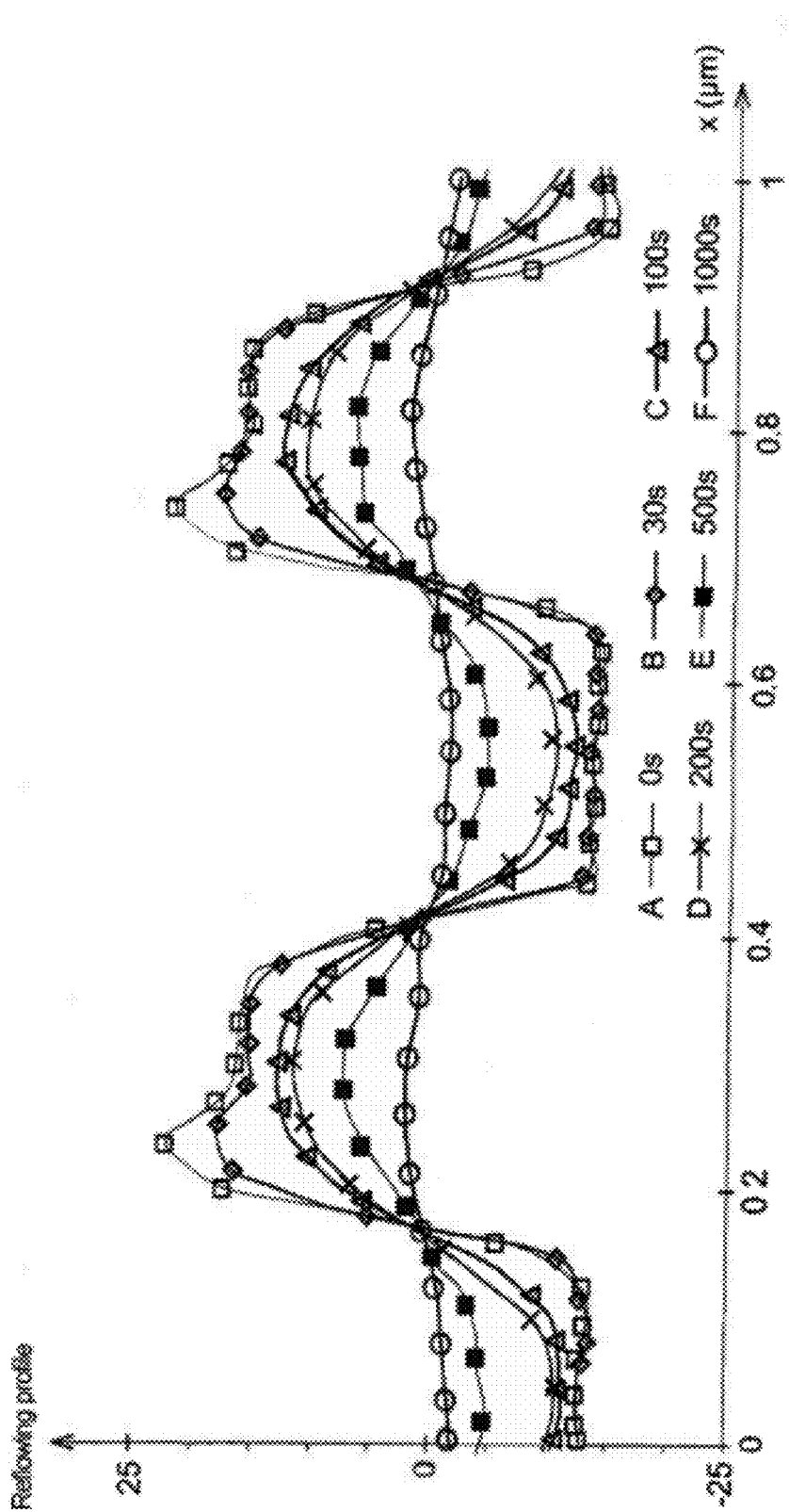
FIG. 5 is a graph showing the variation in experimental profile of a dense linear array with a height of 35 nm and a period of 500 nm printed in a polystyrene substrate for various annealing, flow times at a temperature of 150° C., that is 0 second, 30 seconds, 100 seconds, 200 seconds, 500 seconds, and 1000 seconds.

The knowledge of the physical properties of the resin or of the mineral material, such as the viscosity and surface energy, serves in particular:

to eliminate the roughness or a defect on the structuration by a very short flow time ("temps de fluage") $t_R$. By way of example, as shown in FIG. 5, 30 seconds of annealing serve to eliminate the bumps present on the left hand side of the initial pattern of the first nanostructuration;

to finely control the shape of the patterns by longer annealing times for example between 100 seconds and 1000 seconds as shown in FIG. 5.

The inventive method, which makes use of a technique of nano-imprint of a resin or of the mineral material having flow properties, exploits these properties to create nanostructured substrates of which the nanostructuration and in particular the shape of the patterns is perfectly controlled.

The nanostructuration and in particular the shape of the patterns of this nanostructuration and their frequency, period, having a decisive influence on the optical extraction of an OLED comprising the nanostructured substrate prepared by the inventive method, the annealing, flow time also serves to perfectly control the optical extraction of the OLED and to obtain a more or less reinforced optical extraction.

In fact, the longer the annealing time, the more the amplitude of the patterns of the first nanostructuration is attenuated, reduced, and the more the optical extraction is diminished.

To reinforce the extraction in the visible range, the second nanostructuration may be in the form of a linear array with a period of 100 to 600 nm, preferably of 200 nm to 600 nm and with a height of 5 to 40 nm in the case in which the first nanostructuration was in the form of a linear array with a period of 100 to 600 nm, preferably of 200 to 600 nm, and with a height of 5 to 40 nm.

To define the second nanostructuration with regard to the first nanostructuration from which it is derived, it may be said that the second nanostructuration, owing to the flow of the organic resin or of the low melting point mineral material, has a surface on which the patterns, shapes, of the first nanostructuration, have been rounded, softened, attenuated. The second nanostructuration no longer has the defects such as bumps, roughness, discontinuities, asperities and spikes which the first nanostructuration could have. The second nanostructuration no longer comprises patterns with acute, obtuse, right angles, sharp edges, patterns with a high slope, pointed patterns: these patterns are softened, rounded, attenuated to a varying degree according to the relaxation time as stated above. To simplify, it may be said that the second structuration has a surface which only has regular curves, such as grooved or relief sinusoids.

Another definition of the nanostructuration is that it is a nanostructuration free of defects and/or shapes that would be liable to cause short-circuits in an OLED.

The surface or the shape of the second nanostructuration may be described by a Fourier series decomposition (sinusoidal function decomposition). The second nanostructuration corresponds to a Fourier series decomposition limited to the $10^{th}$ order, for example having the order 5, 2 or 1. The $10^{th}$ order limitation means that more rounded shapes are obtained than in the case of a $50^{th}$ order decomposition for example.

On the contrary, the surface or the shape of the first nanostructuration may be described by a Fourier series decomposition having an order higher than 10, for example order 50. The $50^{th}$ order decomposition for a linear array produces square or rectangular patterns (with intervals, slots) whereas a $1^{st}$ order decomposition is a sinusoid.

On completion of the step of annealing, flow of the resin or of the mineral material, the temperature of the resin or of the mineral material is lowered, generally to ambient temperature, generally they are no longer subjected to heating, and they are maintained at ambient temperature for a sufficient time to solidify the resin or the mineral material.

Optionally, an annealing step is carried out (not to be confused with the annealing, flow already described above) on the solid resin or on the solid mineral material at a temperature which is generally a temperature higher than the melting point or the glass transition temperature, for example of at least 300° C. during a time for example of 30 seconds to 1 minute to harden the resin, for example thermosetting, that is to reinforce the hardness of the resin and thereby make it stronger, because annealing serves to reorganize the atoms.

It is then possible to fabricate an organic light emitting diode which comprises as substrate the nanostructured substrate prepared by the inventive method described above.

Any organic light emitting diode can be fabricated by the inventive method, provided that the substrate is prepared by the inventive method as described above.

To fabricate this organic light emitting diode, the various layers constituting an OLED are successively deposited matching the nanostructured surface, on the substrate prepared by the inventive method.

It should be noted that any description relative to the type, number, arrangement, shape of the OLED layers given below is only provided for information, illustration, and is non-limiting, and that the same advantages are obtained regardless of the number, type, arrangement of these OLED layers, provided that the substrate is a nanostructured substrate prepared by the inventive method.

The OLED fabricated by the inventive method for fabricating an OLED may be one of the OLEDs described above such as the one described in FIG. 1 or an OLED such as the one described in document [5] or [6] or even in document [7].

Generally speaking, an anode, a cathode and emissive organic layers may be deposited on the substrate (or superstrate), the light emitting organic layers being deposited between the anode and the cathode. All these deposits are obviously made according to the invention, in a matching way (matchingly).

When the emission is seen through the anode, the anode must be transparent or essentially transparent.

Transparent anode materials are for example indium tin oxide (ITO), indium zinc oxide (IZO) and tin oxide, but other metal oxides could be used, or even metal sulphides or selenides.

When the emission is seen through the cathode, any conductive material can be used for the anode, whether transparent, opaque or reflecting. Mention may be made in particular of aluminium, gold, iridium, molybdenum, platinum and palladium.

The anode may be deposited for example by evaporation, cathode sputtering, chemical vapour deposition or by an electrochemical technique.

According to the invention, the anode is deposited matchingly on the nanostructured surface of the substrate prepared by the inventive method.

Above the anode, a hole (also called positive charge) transport layer is deposited, containing at least one hole transport compound such as an aromatic tertiary amine compound, a polycyclic aromatic compound, or a hole transport polymer.

Between the hole transport layer and the anode, it may be necessary to provide a hole injection layer which for example comprises porphyrinic compounds or aromatic amines.

According to the invention, the hole injection layer and the hole transport layer match the nanostructuration of the substrate surface.

The hole injection layer and the hole transport layer may optionally be combined.

Above the hole transport layer, one or more emitting organic layer(s) are deposited.

The OLED may comprise only one emitting layer, but it may optionally comprise several emitting layers, for example two or three superimposed emitting layers.

In the case in which three emitting layers are present, these layers may be layers emitting respectively in the blue, the green and the red to provide white light (as defined in the standard CIE diagram of 1931 or 1976).

The materials constituting these emitting layers are known to a person skilled in the art.

These emitting layers match the nanostructuration of the substrate and therefore have the same surface patterns.

This or these emitting layers are generally deposited by thermal evaporation.

On the emitting layer or layers, an electron transport layer, followed by an electron injection layer, which obviously match the nanostructuration of the substrate, are deposited. These two layers may be combined and they may optionally be combined with the emitting layer or layers.

Finally, the cathode of the OLED, which according to the invention also matches the nanostructured surface of the substrate, is then deposited.

When the light is only emitted through the anode, the cathode may be made of any conductive material.

If the light is emitted through the cathode, it must be transparent to the light emitted and may for example be made from indium tin oxide (ITO) or from indium zinc oxide (IZO).

The cathode is generally deposited by evaporation, cathode sputtering, or chemical vapour deposition.

Other layers, also matching the nanostructured surface of the substrate, may be provided, such as a hole blocking layer and an electron blocking layer.

The invention will now be described with reference to the following examples, provided for illustration and non-limiting.

EXAMPLES

Example 1

In this example, a substrate is prepared by the inventive method using a thermosetting resin, and an organic light emitting diode is then prepared on the said substrate by the inventive method.

The substrate preparation method comprises the following successive steps:
  deposition of the thermosetting resin Neb® 22 from Sumitomo Chemical Japan available on the market, on an 8 inch silicon wafer;
  compression of the resin at 110° C. for 5 minutes under 300 mbar, whereby a first nanostructuration is obtained, which is an array of lines or an array of bumps with a period of 200 to 600 nm and heights of 5 to 40 nm;
  flow at 125° C. for 60 seconds;
  solidification for example for 248 minutes at ambient temperature, and annealing at 90° C. for 60 seconds.

A second nanostructuration is thereby obtained, "flowed" and stable up to 200° C. which is an array of lines or an array of bumps with a period of 200 to 600 nm and heights of 5 to 40 nm.

The "OLED" layers are then deposited on the nanostructured substrate obtained.

Example 2

In this example, a substrate is prepared by the inventive method using a polystyrene resin, and an organic light emitting diode is then prepared on the said substrate by the inventive method.

The substrate preparation method comprises the following successive steps:
  deposition of the polystyrene resin, on an 8 inch silicon wafer;
  compression of the resin at 120° C. for 5 minutes under 300 mbar, whereby a first nanostructuration is obtained, which is an array of lines with a height of 35 nm and a period of 500 nm;
  flowing is carried out at a temperature of 150° C. for variable times;
  and solidification for example for 248 minutes at ambient temperature, and an annealing at 90° C. for 60 seconds is carried out.

The annealing or reflowing profiles obtained are then observed for the various flow times. The profiles are shown on the graph in FIG. 5.

Curve A (points □) shows the profile of the second nanostructuration for a flowing, "remelting" time of 0 second (the second nanostructuration has an identical profile to that of the first nanostructuration).

Curve B (♦ grey points) shows the profile of the second nanostructuration for a flow time of 30 seconds.

Curve C (▲ grey points) shows the profile of the second nanostructuration for a flow time of 100 seconds.

Curve D (points X) shows the profile of the second nanostructuration for a flow time of 200 seconds.

Curve E (points ■) shows the profile of the second nanostructuration for a flow time of 500 seconds.

Curve F (○ points) shows the profile of the second nanostructuration for a flow time of 1000 seconds.

The graph in FIG. 5 shows that at 0 second, defects are present, at 30 seconds defects such as discontinuities are still present, but from 100 seconds, the defects have been eliminated and a sinusoidal array is obtained.

For the rest of the method, the preferable substrate is the one in which the polystyrene resin has undergone flow at 150° C. for 100 seconds and in which the second nanostructuration, which is stable up to 200° C., is a sinusoidal array of lines with a height of 25 nm and a period of 500 nm.

The OLED layers are then deposited on the nanostructured substrate obtained.

The invention claimed is:

1. Method for fabricating a substrate comprising a nanostructured surface for an organic light emitting diode OLED, in which the following successive steps are carried out:
  a) a layer of an organic resin or of a low melting point mineral material is deposited on a planar surface of a substrate;
  b) the organic resin is heated to a temperature equal to or higher than its glass transition temperature Tg or its melting point, or the mineral material is heated to a temperature equal to or higher than its melting point, and the layer of liquid organic resin or mineral material is printed with a mould having a nanostructuration, whereby the layer of organic resin or mineral material is provided with a first nanostructuration matching the nanostructuration of the mould;
  c) the temperature of the organic resin or of the mineral material is lowered to a temperature at which it is solid;
  d) the mould is separated from the layer of organic resin or of mineral material joined to the substrate; characterized in that the method further comprises the following successive steps:
  e) the organic resin is heated to a temperature equal to or higher than its glass transition temperature Tg or its melting point, or the mineral material is heated to a temperature equal to or higher than its melting point, and the organic resin or the mineral material is maintained at this temperature for a time $t_R$ called annealing time, whereby the organic resin or the mineral material flows and the first nanostructuration of the layer of organic resin or of mineral material is modified to produce a second nanostructuration which is free of defects and/or of shapes liable to cause short-circuits in an OLED;
  f) the organic resin or the mineral material is cooled below its glass transition temperature or its melting point to solidify it;
  g) optionally, the solid organic resin or the solid mineral material is annealed.

2. Method according to claim 1, in which the substrate is a material selected from glass, transparent ceramics, and transparent plastics.

3. Method according to claim 1, in which the organic resin has a glass transition temperature Tg or a melting point higher than the subsequent deposition temperature(s) of one or more other layer(s) on the nanostructured surface.

4. Method according to claim 1, in which the resin is selected from thermoplastic resins and thermosetting resins such as poly(styrene)s (PS), poly(methyl methacrylate)s (PMMA), unsaturated polyesters, epoxy resins, phenolic resins, polyimides, polyamides, polycarbonates, polyolefins such as polypropylenes, POSS or polyhedral oligomeric silsesquioxane and mixtures thereof.

5. Method according to claim 1, in which the mineral material has a melting point higher than the subsequent deposition temperature(s) of one or more other layer(s) on the nanostructured surface.

6. Method according to claim 1, in which the mineral material has a melting point lower than 200° C.

7. Method according to claim 1, in which the layer of organic resin or of mineral material has a thickness of at least 10 nm, preferably of 10 nm to 10 µm.

8. Method according to claim 1, in which the layer of organic resin is deposited by a method selected from dip-coating; spin-coating; laminar-flow coating; spray-coating; soak-coating; roll-to-roll coating; painting-coating; screen printing; chemical vapour deposition (CDV); plasma enhanced chemical vapour deposition (PECVD or PACVD).

9. Method according to claim 1, in which the layer of mineral material is deposited by a method selected from chemical vapour deposition (CVD); plasma enhanced chemical vapour deposition (PECVD or PACVD); a crystal growth technique such as epitaxy.

10. Method according to claim 1, in which the first nanostructuration consists of a periodic array, such as a one-dimensional or a two-dimensional array.

11. Method according to claim 10, in which the first nanostructuration is an array of lines with periodic patterns having a period P and a height h, or an array of bumps.

12. Method for fabricating a substrate comprising a nanostructured surface for an organic light emitting diode OLED, in which the following successive steps are carried out:
- a) a layer of an organic resin or of a low melting point mineral material is deposited on a planar surface of a substrate;
- b) the organic resin is heated to a temperature equal to or higher than its glass transition temperature Tg or its melting point, or the mineral material is heated to a temperature equal to or higher than its melting point, and the layer of liquid organic resin or mineral material is printed with a mould having a nanostructuration, whereby the layer of organic resin or mineral material is provided with a first nanostructuration matching the nanostructuration of the mould;
- c) the temperature of the organic resin or of the mineral material is lowered to a temperature at which it is solid;
- d) the mould is separated from the layer of organic resin or of mineral material joined to the substrate; characterized in that the method further comprises the following successive steps:
- e) the organic resin is heated to a temperature equal to or higher than its glass transition temperature Tg or its melting point, or the mineral material is heated to a temperature equal to or higher than its melting point, and the organic resin or the mineral material is maintained at this temperature for a time $t_R$ called annealing time whereby the organic resin or the mineral material flows and the first nanostructuration of the layer of organic resin or of mineral material is modified to produce a second nanostructuration;
- f) the organic resin or the mineral material is cooled below its glass transition temperature or its melting point to solidify it;
- g) optionally, the solid organic resin or the solid mineral material is annealed;

in which the first nanostructuration consists of a periodic array, such as a one-dimensional or a two-dimensional array; in which the first nanostructuration is an array of lines with periodic patterns having a period P and a height h, or an array of bumps; and in which the annealing time $t_R$ in the case of a linear array is expressed by the formula:

$$\frac{1}{t_R} = \frac{1}{\eta}\left(\frac{(2\pi)^4 \gamma}{3} \frac{e^3}{\lambda_n^4}\right)$$

where
- $\eta$ is the viscosity of the resin, or of the mineral material,
- $\gamma$ is the surface energy of the resin or of the mineral material,
- e is the film thickness of the resin or of the mineral material,
- $1/\lambda_n$ is the frequency of the spatial pattern to be caused to flow, that is, the frequency of the spatial pattern of the first nanostructuration.

13. Method according to claim 1, in which the annealing time $t_R$ is of 0 to 1000 seconds, preferably of 30 to 500 seconds, and even more preferably of 100 to 200 seconds.

14. Method according to claim 1, in which the surface of the second nanostructuration is described by a Fourier series decomposition, which does not exceed the $10^{th}$ order, for example which has the order 1, 2 or 5.

15. Method according to claim 1, in which the surface of the second nanostructuration consists of sinusoidal patterns.

16. Method for fabricating an organic light emitting diode comprising fabricating a substrate comprising a nanostructured surface in which said method is carried out by:
- a) a layer of an organic resin or of a low melting point mineral material is deposited on a planar surface of a substrate;
- b) the organic resin is heated to a temperature equal to or higher than its glass transition temperature Tg or its melting point, or the mineral material is heated to a temperature equal to or higher than its melting point, and the layer of liquid organic resin or mineral material is printed with a mould having a nanostructuration, whereby the layer of organic resin or mineral material is provided with a first nanostructuration matching the nanostructuration of the mould;
- c) the temperature of the organic resin or of the mineral material is lowered to a temperature at which it is solid;
- d) the mould is separated from the layer of organic resin or of mineral material joined to the substrate; characterized in that the method further comprises the following successive steps:
- e) the organic resin is heated to a temperature equal to or higher than its glass transition temperature Tg or its melting point, or the mineral material is heated to a temperature equal to or higher than its melting point, and the organic resin or the mineral material is maintained at this temperature for a time $t_R$ called annealing time, whereby the organic resin or the mineral material flows and the first nanostructuration of the layer of organic resin or of mineral material is modified to produce a second nanostructuration which is free of defects and/or of shapes liable to cause short-circuits in an OLED;
- f) the organic resin or the mineral material is cooled below its glass transition temperature or its melting point to solidify it;
- g) optionally, the solid organic resin or the solid mineral material is annealed.

17. Method according to claim 16, in which a substrate comprising a nanostructured surface is fabricated, and a first electrode layer matching the nanostructured surface, one or more emitting organic layer(s) matching the nanostructured surface, and a second electrode layer matching the nanostructured surface are then successively deposited on the nanostructured surface of the substrate.

18. Method according to claim 17, in which the first electrode is an anode and the second electrode is a cathode.

19. Method according to claim 17, in which one or more other layer(s) matching the nanostructured surface are further deposited on the substrate, selected from a hole injection layer, a hole transport layer, an electron injection layer, an electron transport layer, a hole blocking layer, an electron blocking layer, a thin film transistor (TFT) layer, two or more from these other layer(s), the emitting organic layer(s), the first electrode layer and the second electrode layer optionally being combined.

* * * * *